United States Patent [19]

Tozawa et al.

[11] Patent Number: 5,414,300
[45] Date of Patent: May 9, 1995

[54] LID FOR SEMICONDUCTOR PACKAGE AND PACKAGE HAVING THE LID

[75] Inventors: Yoji Tozawa, Yamaguchi; Shizuki Hashimoto, Asa; Tetsuya Yamamoto, Mine, all of Japan

[73] Assignee: Sumitomo Metal Ceramics Inc., Yamaguchi, Japan

[21] Appl. No.: 301,186

[22] Filed: Sep. 6, 1994

[30]  Foreign Application Priority Data

Dec. 10, 1993 [JP]  Japan .................. 5-345754
Apr. 28, 1994 [JP]  Japan .................. 6-126724

[51] Int. Cl.⁶ ............................. H01L 21/00
[52] U.S. Cl. ................... 257/704; 428/637; 428/645
[58] Field of Search ........... 257/704, 697, 772; 428/637, 645, 668, 669; 174/52.4

[56]  References Cited

U.S. PATENT DOCUMENTS

| | | | |
|---|---|---|---|
| 4,356,047 | 10/1982 | Gordon et al. | 156/89 |
| 4,487,638 | 12/1984 | Hoge | 148/24 |
| 4,746,583 | 5/1988 | Falanga | 428/632 |
| 4,833,102 | 5/1989 | Bryne et al. | 257/704 |

FOREIGN PATENT DOCUMENTS 3-145747  6/1991  Japan .
5-144966  6/1993  Japan .

*Primary Examiner*—Rolf Hille
*Assistant Examiner*—Roy Potter
*Attorney, Agent, or Firm*—Flynn, Thiel, Boutell & Tanis

[57]  ABSTRACT

In a ceramic lid for sealing a semiconductor device mount portion of a ceramic package substrate having a semiconductor device mounted thereon, a seal layer disposed in an outer peripheral edge portion of a lid is formed by a solder comprising 2 to 15 wt % of Bi, 2.0 to 6.0 wt % of Sn, 0.5 to 2.0 wt % of In, 0.5 to 2.0 wt % of Ag and the balance of Pb, through an Ag—Pt system underlying metallized layer. A semiconductor package comprising a semiconductor package substrate and a lid is sealed by the lid.

4 Claims, 2 Drawing Sheets

LID FOR SEMICONDUCTOR PACKAGE AND PACKAGE HAVING THE LID

BACKGROUND OF THE INVENTION

1. Field of the Invention

This invention relates to a ceramic lid for sealing a semiconductor device mount portion of a package substrate accommodating a semiconductor device and a semiconductor package using this lid.

2. Description of the Prior Art

A semiconductor device such as an integrated circuit is accommodated in a semiconductor device mount portion disposed on a package substrate, and is put to practical application after this mount portion is hermetically sealed by the ceramic lid (hereinafter called the "lid"). When heat-resistance, durability and reliability are required, ceramics such as alumina have been used as the material of the package substrate and the lid. When the ceramic substrate is sealed by the ceramic lid, a solder is used as a sealing material. Because the solder cannot be bonded directly to the ceramics, means for depositing an underlying metallized layer has been generally employed for the solder seal portions of the package substrate and the lid. Accordingly, the package substrate and the lid are bonded to each other by the solder through the underlying metallized layer.

The underlying metallized layer of the package substrate employs the structure comprising a metallized layer of a refractory metal such as W, Mo, etc, which can be cofired with the ceramic greensheets, and a Ni plating and an Au plating applied to the metallized layer. This structure secures bondability with the solder at the time of sealing and long-term reliability as a package. A metal such as Au, Ag—Pd, etc, is used in most cases as the underlying metallized layer of the lid.

The structure of the semiconductor package according to the present invention will be explained with reference to FIGS. 1 and 2. A semiconductor device 8 is stored in a semiconductor device mount portion 7 as a recess of a package substrate 2, and the semiconductor device mount portion is hermetically sealed by a lid 1. As shown in FIG. 1, the lid 1 includes an underlying metallized layer 5 disposed on peripheral edge portions (outer peripheral portion of an upper surface and side surfaces) 4 of a ceramic substrate 3, and a seal layer 6 as a sealing member disposed on the underlying metallized layer 5. A method of sealing the semiconductor device accommodated in the package substrate by the lid 1 is as follows. The semiconductor device 8 is first accommodated in, and mounted to, the semiconductor device mount portion 7 of the package substrate 2, and then a seal layer 6 of the lid is so superposed as to face an underlying metallized layer 10 formed on the upper surface of the package substrate 2. The lid 1 and the package substrate 2 are fixed by fixing members such as springs, clips, or the like. The solder is melted under such state through a heating furnace and is then cooled. In this way, the semiconductor device 8 is hermetically sealed inside the package substrate.

If the temperature is excessively high during this heating operation, the semiconductor device is likely to be damaged or broken. Accordingly, Japanese Patent Laid-Open No. 144966/1993 proposes a package characterized by using a solder having a low melting point. In other words, this reference disposes a package sealed by a solder alloy comprising, as a chemical composition, 1.0 to 10.0 wt % of at least one of Sn and In, 1.0 to 10.0 wt % of Ag, 3.0 to 13.0 wt % of Bi and the balance of Pb. The melting point of this solder is around 270° C.; hence, its melting point is said to be lower by about 25° C. than the melting points of conventional solders. Ag—Pd is concretely used as the underlying metallized layer of the lid.

Japanese Patent Laid-Open No. 145747/1991 discloses a lid which utilizes Ag—Pt as an underlying metal of an economical lid having high reliability, and which is equipped with a solder layer of a low melting-point solder chemically adaptive to the underlying metal, having high wethability with an Au plating as the underlying metal of the package substrate and comprising 4.0 to 6.2 wt % of Sn, 1.5 to 5.0 wt % of In, 1.5 to 3.0 wt % of Ag and the balance of Pb. Ag—Pt (Pt: 1 to 2 wt %) as the underlying metal has a characterizing feature in that its material cost is by far lower than Ag—Pd (Pd: 20 to 30 wt %).

Characteristics of a sealing solder layer on a lid and sealing characteristics between this lid and a semiconductor package substrate must satisfy the following requirements:

(1) High bondability can be obtained between the solder layer and the underlying metallized layer when the solder layer is formed on the underlying metallized layer by reflow, for the lid.

(2) When the package substrate is sealed by the lid, good bondability should be obtained between the solder and the underlying metallized layer of the package substrate.

(3) Sealing can be made at a temperature as low as 300° C. or below.

(4) Seal performance can be stably maintained for a long time for the sealed package.

The package disclosed in Japanese Patent Laid-Open No. 144966/1993 described above involves the following problems. In the case of the combination of an (Sn, In)—Ag—Bi—Pb system 4- or 5-component system solder with the Ag—Pd underlying metallized layer, Sn and In as the solder alloy components and Pd of the underlying metallized layer are likely to undergo alloying, and solder leaching is likely to occur and the underlying metallized layer is corroded. Accordingly, bondability drops, and stable seal performance cannot be obtained for a long term.

In the lid described in Japanese Patent Laid-Open No. 145747/1991, the melting point of the solder used is between 300° and 350° C. Therefore, the lid cannot satisfy the requirement for seal at a temperature lower than the temperature range described above.

SUMMARY OF THE INVENTION

In view of the above-described status of the art, it is an object of the present invention to provide an economical lid for a semiconductor package which can satisfy the requirement for low temperature sealing of a package below 300° C., which has been required in recent year, and has long-term stability as to air-tightness, high reliability and high bonding strength.

It is another object of the present invention to provide a semiconductor package obtained by using this lid.

The lid according to the present invention is characterized in that the lid includes a seal layer formed through an underlying metallized layer consisting of an Ag—Pt system metallized layer on a peripheral edge surface of the lid facing a ceramic package substrate, and said seal layer is formed by a solder comprising 2 to 15 wt % of Bi, 2.0 to 6.0 wt % of Sn, 0.5 to 2.0 wt % of In, 0.5 to 2.0 wt % of Ag and the balance of Pb.

The package according to the present invention is a package which has a semiconductor device mounted thereon and a semiconductor device mount portion of which is sealed by a ceramic lid, characterized in that the semiconductor device mount portion of the ceramic package substrate is sealed by a solder having a chemical composition comprising 2 to 15 wt % of Bi, 2.0 to 6.0 wt % of Sn, 0.5 to 2.0 wt % of In, 0.5 to 2.0 wt % of Ag and the balance of Pb, through an underlying metallized layer disposed on the ceramic package substrate and through an Ag—Pt system underlying metallized layer disposed on the ceramic lid.

The above and other objects, features and usages of the present invention will become more apparent on reading the following description in conjunction with the accompanying drawings.

DETAILED DESCRIPTION OF THE INVENTION

Figure 1:
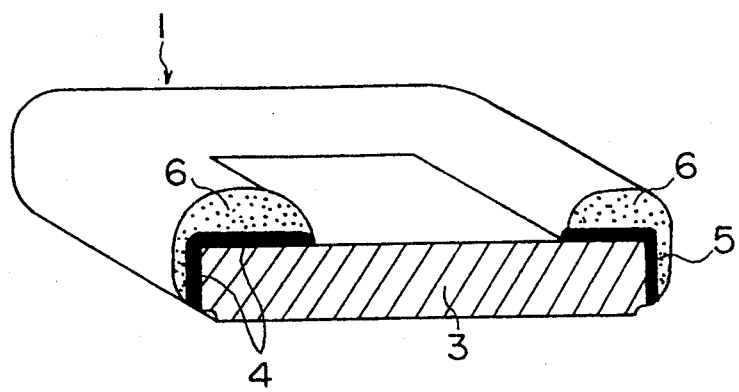
FIG. 1 is a sectional perspective view of a lid for sealing a semiconductor package according to the invention.

In the lid or the package according to the present invention, the chemical composition of a solder forming a seal layer comprises 2 to 15 wt % of Bi, 2.0 to 6.0 wt % of Sn, 0.5 to 2.0 wt % of In, 0.5 to 2.0 wt % of Ag and the balance of Pb. Therefore, the melting point is as low as 250° to 300° C. Accordingly, seal of the semiconductor package can be made at a temperature below 300° C. Since the composition contains a suitable amount of Sn, the solder has high wettability with Au plating on the surface of an underlying metallized layer of a package substrate, and In secures thermal impact resistance of a seal layer after sealing. Further, the chemical reaction between the underlying metallized layer and the solder components is restricted by forming an Ag—Pt system the underlying metallized layer of the lid and using a minimum necessary amount of Ag as one of the solder components. Accordingly, solder leaching, which occurs in a reflow processing for forming the solder layer to the lid, can be prevented. At the same time, the content of Ag is limited to the minimum necessary amount and the rise of the melting point of the solder resulting from Ag is limited to minimum. Accordingly, even in the case of a seal temperature of not higher than 300° C., the solder has high fluidity at the time of seal and as a result, excellent sealability can be obtained.

The material of the ceramic substrate of the present invention is ceramics as already described, and alumina is generally used. Ceramics other than alumina, such as silica, mullire, aluminum nitride, silicon nitride and silicon carbide, can also be utilized depending on applications.

The range of the chemical composition of the solder forming the seal layer of the lid or the package of the present invention is as follows.

Bi is primarily used to lower the melting point of the solder. When the amount of Bi is not greater than 2 wt %, the melting point of the solder cannot be sufficiently lowered. When it exceeds 15 wt %, the melting point of the solder is excessively lowed to about 230° C. For this reason, the solder of the seal layer is molten by heating (230° to 240° C.) when the semiconductor package after sealing is bonded to a printed board, and the problem that seal becomes incomplete occurs. Accordingly, the Bi content is suitably from 2 to 15 wt %.

Sn is a component which is necessary for improving wettability between the Au plating surface of the underlying metallized layer of the package substrate and the solder when the package substrate is sealed by the lid. When the Sn content is not greater than 2.0 wt %, a sufficient improvement effect of wettability cannot be obtained. When it exceeds 6.0 wt %, on the other hand, cracks are likely to occur in the seal layer after sealing for the following reason.

Au in the plating layer which is from about 1 to 2 μm thick is molten in the solder layer at the time of sealing. At this time, Au and Sn react with each other and form a rigid Au—Sn alloy layer at the boundary portion between the solder layer and the Ni plating layer. A brittle Pb—Au layer is formed in the solder layer, too. Accordingly, when any stress occurs due to heating or cooling after the semiconductor device is assembled and used as a semiconductor package, cracks develop in the Au—Sn alloy layer that is formed at the boundary portion between the solder layer and Ni plating layer, and grow in the brittle Pb—Au layer in the solder layer. In consideration of these facts, the upper limit of the Sn content is set to 6.0 wt %.

In provides the effect of preventing the occurrence of cracks in the seal layer after sealing. As described above, though Sn has the function of improving wettability between the solder and the Au plating surface, it is the component that is likely to cause cracks. In reacts with Sn and Au and forms an In—Sn—Au alloy layer having tenacity. Therefore, when In exists, the formation of the brittle Au—Sn and Pb—Sn alloy layers can be restricted, and the occurrence of cracks in the seal layer can be prevented. The suitable In content is related with the Sn content, too. When the Sn content is from 2.0 to 6.0 wt % as described above, the In content is suitably from 0.5 to 2.0 wt %. When the In content is less than 0.5 wt %, cracks are likely to occur in the seal layer in some cases, and the effect of In described above cannot be sufficiently obtained. When it exceeds 2.0 wt %, air-tightness tends to drop in the course of long time use.

A suitable Ag content is from 0.5 to 2.0 wt %. As described above, Ag in the solder is indispensable for restricting the reaction between Ag of the lid underlying metallized layer and the solder at the time of the formation of the solder layer on the lid. When Ag does not exist in the solder layer, the reaction between Ag in the underlying metallized layer and the solder components becomes remarkable, and solder leaching occurs in the underlying metallized layer. Since solder leaching lowers the bonding strength between the underlying metallized layer and the ceramic substrate, the bonding strength drops under the state where the package substrate is sealed by the lid.

This solder leaching can be prevented by allowing the solder to contain Ag. When the solder layer is formed on the ceramic substrate, a paste containing the solder is printed on the Ag—Pt system underlying metallized layer and reflow is then carried out. Since this reflow is carried out at a temperature about 20° C. higher than the melting point of the solder, the heating temperature is about 310° C. in the case of the lid according to the present invention. The temperature at the time of this reflow affects the degree of the chemical reaction between the components in the solder and Ag of the underlying metallized layer. In the case of those lids which contain the Ag—Pt system underlying metal according to the present invention, the effect of Ag appears at the Ag content of 0.5 wt % in the solder at the reflow temperature of around 310° C. When the Ag content exceeds 2.0 wt %, the following problems develop:

(1) The melting point of the solder rises.
(2) Since the melting point of the solder is high, fluidity of the solder is inferior when sealing is made at a temperature lower than 300° C., and seal defects are likely to occur.

Accordingly, the Ag content is not greater than 2.0 wt %. As described above, the Ag content in the solder is preferably restricted to the minimum necessary amount, and the suitable Ag content is from 0.5 to 2.0 wt % in the case of the combination of the Ag—Pt system underlying metal with the solder having a melting point of not higher than about 300° C.

The Ag—Pt system material is used as the material of the underlying metallized layer of the lid in order to secure stable sealability for a long time and to obtain economy. Pt in the underlying metallized layer restricts the reaction between the underlying metallized layer and the solder components and reduces solder leaching. As already described, Ag is contained also in the solder in order to prevent solder leaching of the underlying metal. Accordingly, the Pt content in the underlying metallized layer has the relation with the solder composition.

In the case of the combination with the solder used in the present invention, the proportion of Pt in the underlying metallized layer is suitably from 0.2 to 2.0 wt %. When 0.2 wt % of Pt is contained, solder leaching can be sufficiently restricted and the main object of the addition of Pt can be thus attained. The upper limit of Pt content is 2.0 wt. % in view of economy. An Ag—Pd system (Pd: 20 to 30 wt %) can also be used as the underlying metal besides the Ag—Pt system, but the Ag—Pt system material is superior in the aspect of resistance to solder leaching in the combination with the solder. Further, the Ag—Pt system has higher wettability with the solder than the Ag—Pd system. Incidentally, the thickness of the underlying metallized layer is suitably from about 5 to about 40 μm.

EXAMPLES

Figure 2A:
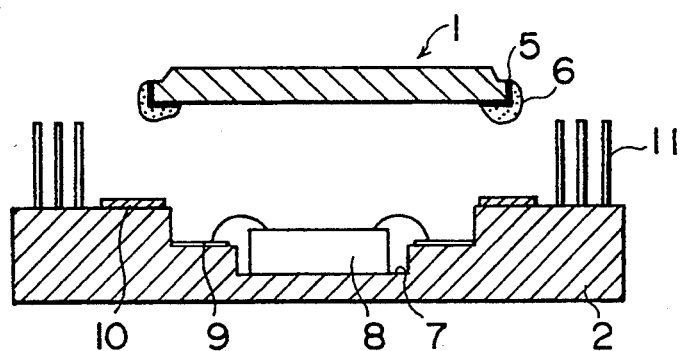
FIG. 2a is a sectional view showing the lid for a semiconductor package in FIG. 1 before it is sealed.
Figure 2B:
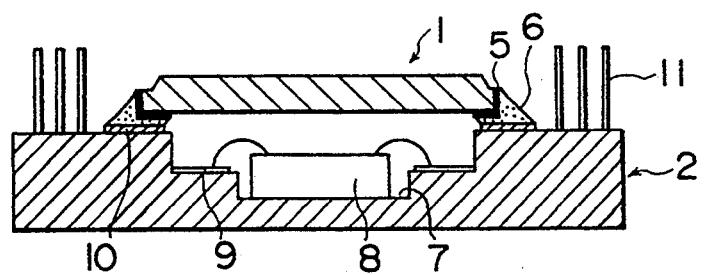
FIG. 2b is a sectional view showing the lid for a semiconductor package in FIG. 1 after it is sealed.

Hereinafter, embodiments of the present invention will be explained with reference to the accompanying drawings. FIGS. 1 to 3 show an embodiment of the present invention, wherein FIG. 1 is a sectional perspective view of the principal portions of the lid according to the present invention, FIG. 2 is sectional views when the lid of FIG. 1 is applied to a pin grid array (PGA) before and after sealing, respectively, and FIG. 3 is a perspective view useful for explaining sealability between the lid and the package substrate.

The lid according to the present invention has the following structure. The material of a ceramic substrate 3 is alumina, the substrate 3 has a square shape having each side of 27 mm and is 0.8 mm thick. An underlying metallized layer 5 and a seal layer 6 made of a solder and deposited on the underlying metallized layer 5 are provided to an outer peripheral portion 4 of this substrate. The underlying metallized layer 5 and the seal layer 6 may be disposed on only the surface which faces the package substrate but in order to obtain more reliable sealability, they are preferably disposed on the side surface portions of the ceramic substrate 3, too. In the case of this embodiment, the underlying metallized layer is about 20 μm thick, and the seal layer is about 150 μm thick.

A production method of the lid 1 is as follows. The ceramic substrate 3 is produced by press-molding and firing alumina powder. Thereafter, it is subjected to barrel polishing using abrasives and washing, and is finished to the ceramic substrate 3. A paste containing Ag and Pt in a proportion of 99:1 in terms of wt % is screen-printed on the outer peripheral surface 4 of this ceramic substrate 3 and is then fired at about 850° C. In this way, the underlying metallized layer 5 consisting of Ag—Pt metallize is formed. A paste containing a solder is screen-printed on the underlying metallized layer, and then reflow is carried out at about 310° C., forming thereby the seal layer 6 consisting of the solder layer.

The chemical compositions of the solders in this experimental example, inclusive of Comparative Examples, fall within the following ranges. The range of the content of each component is as follows in terms of wt %:

| Bi: trace to 17.9%, | Sn: 1.2 to 7.9%, |
| In: 0.2 to 2.8%, | Ag: 0.3 to 2.4% |

The lid obtained in this way is bonded to the package substrate, and a semiconductor package accommodating the semiconductor is completed. To evaluate sealability of the lid, air-tightness of the package, the thermal impact resistance of the seal portion, etc, it is necessary to bond the lid to the package and to make evaluation as the package. The package substrate 2 used for the experimental example and shown in FIG. 2 is of the PGA type, and includes a semiconductor mount portion 7 as a recess for accommodating a semiconductor device 8 and a conductor portion 9 for electrically connecting the semiconductor device 8 by bonding wires (aluminum wires). As the underlying metallized layer 10, a layer consisting of Ni plating and Au plating applied on the Nt plating is formed on a W metallized layer around the periphery of the semiconductor mount portion 7. The conductor portion 9 is electrically connected to external pins 11.

When the semiconductor device mount portion 7 of the package substrate 2 is sealed by the lid 1, the seal layer 6 of the lid 1 is superposed on the underlying metallized layer 10 formed on the upper surface of the package substrate 2, is then fixed by clips, is inserted into a heating furnace and is retained at 300° C. for three minutes in a reducing atmosphere.

To evaluate the lid and the package according to the present invention, the following investigation is carried out for fifty pieces of the packages after sealing obtained in the manner described above:

(1) Sealability evaluation: condition of meniscus of the seal layer formed by the solder layer;
(2) Air-tightness evaluation: air-tightness after preservation at 240° C. for 24 hours (air-tightness in high temperature preservation test)
(3) Thermal impact resistance evaluation: cooling and heating from −65° C. to 150° C. are repeated at 100, 500 and 1,000 cycles and crack occurrence rates are examined (crack occurrence rates in temperature cycle test)

The results are altogether tabulated in Table 1.

Figure 3A:
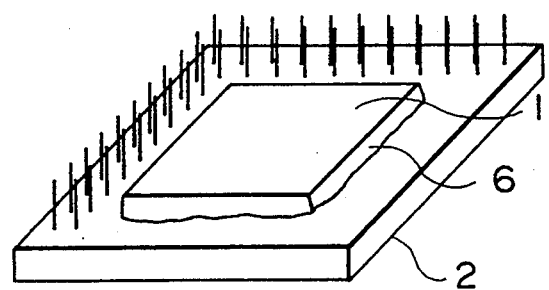
FIG. 3a is a perspective view useful for explaining sealability of a semiconductor package, when sealability is high.
Figure 3B:
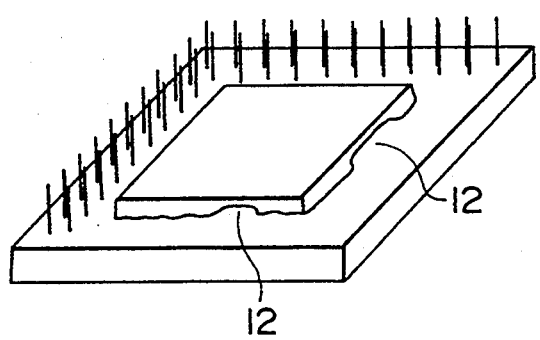
FIG. 3b is a perspective view useful for explaining sealability of a semiconductor package, when sealability is inferior.

Incidentally, sealability is evaluated by the condition of the meniscus of the seal layer. FIG. 3a shows an example of good sealability with good meniscus and FIG. 3b shows an example of defective sealability because a large number of positions 12 having low solder wettability exist and the condition of the meniscus is inferior.

240° C., and they are also free from the occurrence of cracks after the temperature cycle test.

On the other hand, when the chemical compositions of the solders are out of the range of the solder composition of the present invention, the results are not satisfactory as described next. Namely, when Bi is less than 2 wt % (No. 12), the melting point of the solder was high, so that sealing cannot be made at a sealing temperature of 300° C. When Bi exceeds 15 wt % (No. 11), on the other hand, the melting point of the solder becomes so low that the result of the preservation result at a high temperature of 240° C. is inferior.

As to Sn, when the Sn content exceeds 6 wt % (No. 13), cracks occur in the solder layer of the seal portion as a result of the temperature cycle test, and thermal impact resistance is confirmed inferior. When the Sn content is less than 2.0 wt % (No. 14), sealability is not sufficient. This is because wettability of the solder to the Au plating surface of the surface of the underlying metallized layer of the package substrate is not high.

TABLE 1

| | Solder Chemical Composition (wt %) | | | | | Seal-ability | Result* | | | |
|---|---|---|---|---|---|---|---|---|---|---|
| | | | | | | | Air Tightness High temp. Preservation Test | Number of Cracks occurred in Temp. Cycle Test | | |
| NO | Pb | Bi | Sn | In | Ag | | | 100 Cycles | 500 Cycles | 1000 Cycles |
| 1 | balance | 4.2 | 4.1 | 1.0 | 0.8 | 0 | 0 | 0 | 0 | 0 |
| 2 | balance | 8.6 | 3.9 | 1.0 | 0.9 | 0 | 0 | 0 | 0 | 0 |
| 3 | balance | 14.4 | 3.9 | 0.9 | 0.8 | 0 | 0 | 0 | 0 | 0 |
| 4 | balance | 8.1 | 2.5 | 1.0 | 0.8 | 0 | 0 | 0 | 0 | 0 |
| 5 | balance | 8.1 | 5.6 | 1.0 | 0.8 | 0 | 0 | 0 | 0 | 0 |
| 6 | balance | 8.0 | 4.0 | 0.6 | 0.9 | 0 | 0 | 0 | 0 | 0 |
| 7 | balance | 8.0 | 4.0 | 1.5 | 0.8 | 0 | 0 | 0 | 0 | 0 |
| 8 | balance | 8.2 | 4.1 | 0.9 | 0.5 | 0 | 0 | 0 | 0 | 0 |
| 9 | balance | 8.0 | 3.9 | 1.0 | 1.0 | 0 | 0 | 0 | 0 | 0 |
| 10 | balance | 9.1 | 4.0 | 1.1 | 1.7 | 0 | 0 | 0 | 0 | 0 |
| Comparative Examples | | | | | | | | | | |
| 11 | balance | 17.9 | 4.2 | 1.0 | 0.8 | 0 | 16 | 0 | 0 | 0 |
| 12 | balance | tr | 4.0 | 1.1 | 0.7 | 50 | — | — | — | — |
| 13 | balance | 7.8 | 7.9 | 1.0 | 0.7 | 0 | 0 | 0 | 0 | 3 |
| 14 | balance | 8.0 | 1.2 | 1.2 | 0.8 | 4 | 0 | 0 | 0 | 0 |
| 15 | balance | 8.1 | 3.8 | 2.8 | 0.8 | 0 | 4 | 0 | 0 | 0 |
| 16 | balance | 7.9 | 3.8 | 0.2 | 0.8 | 0 | 0 | 6 | 20 | 45 |
| 17 | balance | 8.0 | 4.0 | 0.9 | 0.3 | 0 | 3 | 0 | 0 | 0 |
| 18 | balance | 9.5 | 4.0 | 1.0 | 2.4 | 3 | 0 | 0 | 0 | 0 |

*The Number of defective pieces in 50 pieces.

The following can be confirmed from the results of investigation described above.

The packages using the lid equipped with the seal layer consisting of the solder within the range of the chemical composition of the present invention, that is, Nos. 1 to 10, have high sealability and excellent air-tightness after preservation at a high temperature of As to In, when the In content is less than 0.5 wt % (No. 16), cracks occur in the solder layer after sealing in the temperature cycle test, and a problem occurs in the thermal impact resistance. When the In content exceeds 2.0 wt % (No. 15), air-tightness gets deteriorated in the high temperature preservation test.

As to Ag, when the Ag content is less than 0.5 wt % (No. 17), the effect of improvement in solder leaching is not sufficient and air-tightness is inferior. When the Ag content exceeds 2.0 wt % (No. 18), solder leaching can be improved, but because fluidity of the solder at the time of sealing decreases with the rise of the melting point of the solder, sealability gets deteriorated.

Next, the combination of the solder and the underlying metals used in the present invention is examined. The chemical composition of the solder is the same as that of Example No. 9 of Table 1. The Ag—Pt system and the Ag—Pd system are compared as the underlying metals. The results are tabulated in Table 2.

TABLE 2

| Underlying Metal | Sealability | Air-tightness in High Temp. Test | Number of Cracks occurred in Temperature Cycle Test | | |
|---|---|---|---|---|---|
| | | | 100 Cycle | 500 Cycle | 1000 Cycle |
| Ag—Pt (Pt 0.5%) | 0 | 0 | 0 | 0 | 0 |
| Ag—Pt (Pt 1.5%) | 0 | 0 | 0 | 0 | 0 |
| Ag—Pd (Pd 20%) | 0 | 16 | 0 | 0 | 4 |

*Numerals in Table 2 represent the number of defective pieces in 50 pieces.

As can be clearly seen from Table 2, in the combination of the solder having the chemical composition of the present invention and the Ag—Pt system underlying metal, all of sealability, air-tightness in the high temperature preservation test and the occurrence of cracks in the temperature cycle test are satisfactory both when the Pt contents of the underlying metal are 0.5 wt % and 1.5 wt %. In the case of the Ag—Pd system underlying metal, on the other hand, poor air-tightness in the high temperature preservation test and the occurrence of cracks at 1,000 cycles in the temperature cycle test pose problems.

This is because, solder leaching resulting from the reaction between Ag of the underlying metallized layer and the solder does not exist in the case of the present invention and the formation of the brittle Pb—Sn alloy layer or the Au—Sn alloy layer due to the reaction between the components in the solder and the solder does not exist in the case of the present invention and the formation of the brittle Pb—Sn alloy layer or the Au—Sn alloy layer due to the reaction between the components in the solder and the Au plating layer of the surface of the underlying metal does not exist.

As described above, it has been confirmed that the combination of the solder having the chemical composition and the Ag—Pt system underlying metal used in the present invention provides higher sealability than when other underlying metals are used.

It has been confirmed as described above that the lid and the package according to the present invention have excellent characteristics as the lid for sealing the semiconductor package substrate or the package having the semiconductor devices mounted thereto.

Though the foregoing embodiment deals with the PGA type as the package substrate, other types of packages such as leadless chip carriers (LCCs), and so forth, can of course be the object of the present invention.

As is obvious from the description given above, the ceramic lid for sealing the semiconductor substrate according to the present invention includes the five-component system solder layer of Bi—Sn—In—Ag—Pb for forming the seal layer, disposed on the underlying metallized layer consisting of the Ag—Pt system metallized layer, wherein the chemical composition of the solder comprises 2 to 15% of Bi, 2.0 to 6.0% of Sn, 0.5 to 2.0% of In, 0.5 to 2.0% of Ag in terms of the weight percentage, and the balance of Pb. Accordingly, the bonding strength is high between the ceramic substrate and the solder layer, and economy is also very high.

The semiconductor package sealed by using the lid according to the present invention can be sealed at a temperature of not higher than 300° C., which has been required for sealing the recent semiconductor devices, and the condition of the seal layer (meniscus, etc), air-tightness, thermal impact resistance, etc, are excellent. Accordingly, the package according to the present invention, which is formed by sealing the semiconductor device by using the lid according to the present invention, can stably operate the semiconductor device by using the lid according to the present invention, can stably operate the semiconductor mounted inside the package for a long time.

What is claimed is:

1. A ceramic lid for a semiconductor package, for sealing a semiconductor device mount portion of a ceramic package substrate, characterized in that the lid includes a seal layer formed through an underlying metallized layer consisting of an Ag—Pt system metallized layer on a peripheral edge surface of said ceramic lid facing said ceramic package substrate, and said seal layer is formed by a solder comprising 2 to 15 wt % of Bi, 2.0 to 6.0 wt % of Sn, 0.5 to 2.0 wt % of In, 0.5 to 2.0 wt % of Ag and the balance of Pb.

2. A lid for a semiconductor package according to claim 1, wherein a proportion of Pt of said Ag—Pt system metallize layer is 0.2 to 2.0 wt %.

3. A semiconductor package wherein a semiconductor device mount portion of a ceramic package substrate having said semiconductor device mounted thereon is sealed by a ceramic lid, characterized in that a seal layer is formed by a solder comprising 2 to 15 wt % of Bi, 2.0 to 6.0 wt % of Sn, 0.5 to 2.0 wt % of In, 0.5 to 2.0 wt % of Ag and the balance of Pb through an underlying metallized layer disposed on said ceramic package substrate and through an Ag—Pt system underlying metallized layer disposed on said ceramic lid.

4. A semiconductor package according to claim 3, wherein a proportion of Pt of said Ag—Pt system metallized layer is 0.2 to 2.0 wt %.

* * * * *